United States Patent
Munakata et al.

(10) Patent No.: US 11,691,214 B2
(45) Date of Patent: Jul. 4, 2023

(54) ULTRASOUND HORN

(71) Applicant: SHINKAWA LTD., Musashimurayama (JP)

(72) Inventors: Hiroshi Munakata, Tokyo (JP); Yuhei Ito, Tokyo (JP); John Ditri, Huntingdon Valley, PA (US); Moe Tehrani, Huntingdon Valley, PA (US)

(73) Assignee: SHINKAWA LTD., Tokyo (JP)

( * ) Notice: Subject to any disclaimer, the term of this patent is extended or adjusted under 35 U.S.C. 154(b) by 138 days.

(21) Appl. No.: 17/503,343

(22) Filed: Oct. 17, 2021

(65) Prior Publication Data

US 2023/0125043 A1    Apr. 20, 2023

(51) Int. Cl.
*B23K 20/10* (2006.01)
*B23K 20/00* (2006.01)
*B23K 101/40* (2006.01)

(52) U.S. Cl.
CPC ............ *B23K 20/10* (2013.01); *B23K 20/004* (2013.01); *B23K 2101/40* (2018.08)

(58) Field of Classification Search
CPC .. B23K 20/10–106; B23K 20/004–007; B23K 2101/40; B23K 1/06; B29C 65/08–088
USPC ....... 228/1.1, 4.5, 180.5, 904; 156/73.1–73.6
See application file for complete search history.

(56) References Cited

U.S. PATENT DOCUMENTS

| | | | | |
|---|---|---|---|---|
| 5,326,014 A * | 7/1994 | Morita | ..................... | H01L 24/85 228/110.1 |
| 5,603,445 A * | 2/1997 | Hill | ...................... | B23K 20/106 228/904 |
| 6,279,810 B1 * | 8/2001 | Chan-Wong | ......... | B23K 31/125 228/8 |
| 6,286,747 B1 * | 9/2001 | Chan | ..................... | B06B 1/0261 228/110.1 |
| 8,251,275 B2 | 8/2012 | Deangelis et al. | | |
| 8,408,445 B1 * | 4/2013 | Cai | ........................ | B23K 20/26 228/2.1 |
| 10,381,321 B2 * | 8/2019 | DeAngelis | ............... | B23K 1/06 |
| 11,004,822 B2 * | 5/2021 | Uchida | ................... | H01L 24/78 |
| 2004/0035912 A1 * | 2/2004 | Li | ........................ | B23K 20/106 228/110.1 |
| 2005/0284912 A1 * | 12/2005 | Zhai | ........................ | B06B 3/00 228/1.1 |

(Continued)

FOREIGN PATENT DOCUMENTS

| | | | | |
|---|---|---|---|---|
| CN | 1926916 A | * | 3/2007 | ............... B06B 1/08 |
| CN | 100594088 C | * | 3/2010 | ............. B23K 20/10 |

(Continued)

*Primary Examiner* — Kiley S Stoner
(74) *Attorney, Agent, or Firm* — Kenichiro Yoshida

(57) ABSTRACT

An ultrasound horn is provided which vibrates a bonding tool, attached at a tip, in a plurality of directions with a simple structure. There is provided an ultrasound horn having: a longitudinal vibration generator; a horn portion; and a torsional vibration generator. The torsional vibration generator includes a body including a polygonal pillar portion, second layered elements in which a plurality of second piezoelectric elements are layered, and which are attached to side surfaces of the polygonal pillar portion, weights, and a pressure application ring which applies a pressure by pressing the second piezoelectric elements against the polygonal pillar portion via the weights.

26 Claims, 9 Drawing Sheets

(56) References Cited

U.S. PATENT DOCUMENTS

| | | | | |
|---|---|---|---|---|
| 2014/0138012 A1* | 5/2014 | Spicer | ................... | B23K 20/26 |
| | | | | 156/64 |
| 2016/0023298 A1* | 1/2016 | Song | ...................... | H01L 24/85 |
| | | | | 228/1.1 |

FOREIGN PATENT DOCUMENTS

| | | | | | | |
|---|---|---|---|---|---|---|
| CN | 102099903 | A | * | 6/2011 | ........... | B23K 20/007 |
| CN | 102365725 | A | * | 2/2012 | ........... | B23K 20/005 |
| CN | 104350587 | A | * | 2/2015 | ........... | B23K 20/106 |
| CN | 105834575 | A | * | 8/2016 | ............... | B06B 3/00 |
| CN | 105304513 | B | * | 11/2017 | ........... | B23K 20/005 |
| CN | 108290350 | A | * | 7/2018 | ............. | B29C 65/06 |
| CN | 108555429 | A | * | 9/2018 | ............. | B23K 20/10 |
| CN | 109604813 | A | * | 4/2019 | | |
| CN | 112756763 | A | * | 5/2021 | ............. | B23K 20/10 |
| DE | 102012217437 | A1 | * | 4/2013 | ............. | B23K 20/10 |
| JP | H07227799 | A | * | 8/1995 | | |
| WO | WO-2007143870 | A2 | * | 12/2007 | ............. | B23K 20/10 |
| WO | WO-2008151964 | A1 | * | 12/2008 | ........... | B23K 20/007 |
| WO | WO-2011019692 | A2 | * | 2/2011 | ........... | B23K 20/007 |

* cited by examiner

ULTRASOUND HORN

TECHNICAL FIELD

The present disclosure relates to a structure of an ultrasound horn which ultrasonically vibrates a bonding tool attached to a tip of the horn.

BACKGROUND

Wire bonding apparatuses are widely in use which connect, with a wire, an electrode of a semiconductor die and a lead of a lead frame. The wire bonding apparatus ultrasonically vibrates a capillary in a state in which the wire is pressed against the electrode with the capillary, to bond the wire and the electrode, then bridges the wire over to the lead, and ultrasonically vibrates the capillary in a state in which the bridged wire is pressed against the lead, to thereby bond the wire and the lead.

In order to improve bonding quality and bonding strength, there is proposed a method to vibrate a tip of a bonding tool in a plurality of directions.

For example, JP 6180736 B discloses a method in which an ultrasound vibrator, in which piezoelectric elements, on which two regions separated by a notch in a direction parallel to an electrode plane are formed, are layered, is attached to an ultrasound horn, and powers of different frequencies are supplied to respective regions of the piezoelectric element so that a tip of the bonding tool attached to the ultrasound horn is vibrated in a plurality of directions, thereby creating a scrubbing motion.

However, in the method of JP 6180736 B, there has been a problem in that a structure of the ultrasound vibrator and a driving apparatus becomes complicated.

An advantage of the present disclosure lies in provision of an ultrasound horn which vibrates a bonding tool attached to a tip of the horn in a plurality of directions, with a simple structure.

SUMMARY

According to one aspect of the present disclosure, there is provided an ultrasound horn which is used for a bonding apparatus, the ultrasound horn comprising: a longitudinal vibration generator inside of which a first layered element is attached, in which a plurality of first piezoelectric elements of a plate form which deform in a thickness direction when a voltage is applied are layered, and that generates an ultrasound vibration in a front-and-rear direction; a horn portion that extends from the longitudinal vibration generator toward a front side and on a front end of which a bonding tool is attached; and a torsional vibration generator that extends from the longitudinal vibration generator toward a rear side, wherein the torsional vibration generator comprises: a body which extends from the longitudinal vibration generator toward the rear side and which includes a polygonal pillar portion; two second layered elements in each of which are layered a plurality of second piezoelectric elements of a plate form which shear-deform when a voltage is applied, and which are respectively attached to respective side surfaces of the polygonal pillar portion in such a manner that a direction of layering is along a width direction orthogonal to the front-and-rear direction; weights which are respectively layered at outer sides, in the width direction, of the second layered elements; and a pressure application ring which surrounds the weights, the second layered elements, and the polygonal pillar portion, and which presses the plurality of second piezoelectric elements via the weights onto the polygonal pillar portion, to thereby apply a pressure in the thickness direction to the second piezoelectric elements.

In this manner, the torsional vibration generator is provided, separately from the longitudinal vibration generator, in which are layered the second layered element in which a plurality of the second piezoelectric elements of the plate form which shear-deform when a voltage is applied, and the weights are attached to the side surfaces of the polygonal pillar portion of the body. With such a configuration, a bonding tool attached to the tip is vibrated in a plurality of directions with a simple structure.

According to another aspect of the present disclosure, in the ultrasound horn, the second layered elements can be attached to respective side surfaces of the polygonal pillar portion in such a manner that, when a high-frequency power is applied from a high-frequency power supply, the second layered elements shear-deform in an up-and-down direction orthogonal to the front-and-rear direction and to the width direction, and directions of the shear deformation are opposite from each other, and the second layered elements can also be connected to the high-frequency power supply.

With this configuration, when the high-frequency power is applied to the second layered elements, the second layered elements at the left and right sides of the polygonal pillar portion shear-deform in opposite directions in the up-and-down direction, and respectively move the weights in opposite directions in the up-and-down direction. Thus, a torsional moment can be applied to the polygonal pillar portion, and the polygonal pillar portion can be torsionally vibrated.

According to another aspect of the present disclosure, in the ultrasound horn, in the second layered element, electrode plates can be layered at respective ends and between the second piezoelectric elements, a plurality of the electrode plates can be alternately connected to an output terminal and a ground terminal of the high-frequency power supply toward the direction of layering, the second piezoelectric elements can be layered in such a manner that directions of polarization are alternately reversed, and the second layered elements can be attached to respective side surfaces of the polygonal pillar portion in such a manner that the directions of polarization of the second piezoelectric elements placed at symmetric positions in the width direction with respect to the polygonal pillar portion are opposite in the up-and-down direction, and the electrode plates placed at symmetric positions in the width direction with respect to the polygonal pillar portion can be connected to a same terminal of the high-frequency power supply.

When the second piezoelectric element and the high-frequency power supply are connected in the manner described above, directions of flow, in the width direction, of currents of the high-frequency power supply applied to two second piezoelectric elements adjacent to each other with the electrode plate therebetween are opposite from each other. Additionally, the directions of polarization of the two adjacent second piezoelectric elements are opposite from each other. Thus, currents in opposite directions flow in the two second piezoelectric elements having opposite polarization directions, and, as a result, the two second piezoelectric elements shear-deform in the same direction. With this structure, the second layered elements integrally shear-deform.

In addition, the second layered elements are attached to respective side surfaces of the polygonal pillar portion in such a manner that the directions of polarization of the second piezoelectric elements placed at symmetric positions in the width direction with respect to the polygonal pillar portion are opposite in the up-and-down direction. Incidentally, the electrode plates are placed to be symmetric with respect to the polygonal pillar portion. Therefore, the directions of the flow of the currents are symmetric at the left and the right of the polygonal pillar portion. Because of this, directions of the shear deformation of the second piezoelectric elements placed at the symmetric positions in the width direction with respect to the polygonal pillar portion are opposite in the up-and-down direction such as, for example, an upward direction at the left side and a downward direction at the right side. With this structure, when the high-frequency power is applied to the second layered elements, the second layered elements at the left and the right of the polygonal pillar portion shear-deform in opposite directions in the up-and-down direction, and respectively move the weights in the opposite directions in the up-and-down direction. Thus, a torsional moment can be applied to the polygonal pillar portion, and the polygonal pillar portion can be torsionally vibrated.

According to another aspect of the present disclosure, in the ultrasound horn, in the second layered element, electrode plates can be layered at respective ends and between the second piezoelectric elements, a plurality of the electrode plates can be alternately connected to an output terminal and a ground terminal of the high-frequency power supply toward the direction of layering, the second piezoelectric elements can be layered in such a manner that directions of polarization are alternately reversed, and the second layered elements can be attached to respective side surfaces of the polygonal pillar portion in such a manner that the directions of polarization of the second piezoelectric elements placed at symmetric positions in the width direction with respect to the polygonal pillar portion are identical to each other, and the electrode plates placed at symmetric positions in the width direction with respect to the polygonal pillar portion can be connected to different terminals of the high-frequency power supply.

The second layered elements are attached to respective side surfaces of the polygonal pillar portion in such a manner that the directions of the polarization of the second piezoelectric elements placed at symmetric positions in the width direction with respect to the polygonal pillar portion are the same. In contrast, the electrode plates are not symmetric with respect to the polygonal pillar portion, and the electrode plates placed at symmetric positions in the width direction with respect to the polygonal pillar portion are connected to different terminals of the high-frequency power supply. Because of this, the directions of the currents flowing in the second piezoelectric elements placed at symmetric positions in the width direction with respect to the polygonal pillar portion are opposite from each other. As a consequence, the directions of the shear deformation of the second piezoelectric elements placed at symmetric positions in the width direction with respect to the polygonal pillar portion are opposite from each other in the up-and-down direction, such as, for example, the upward direction at the left side and the downward direction at the right side. With this configuration, when the high-frequency power is applied to the second layered elements, the second layered elements at the left and right sides of the polygonal pillar portion shear-deform in opposite directions in the up-and-down direction, and respectively move the weights in the opposite directions in the up-and-down direction. Thus, a torsional moment can be applied to the polygonal pillar portion, and the polygonal pillar portion can be torsionally vibrated.

According to another aspect of the present disclosure, in the ultrasound horn, the pressure application ring can be formed from a shape memory alloy which contracts when heat is applied.

With this configuration, the pressure can be applied to the second piezoelectric element by a simple method of attaching the pressure application ring at an outer circumference of a structure in which the second layered elements and the weights are attached on the sides of a polygonal pillar portion of the body, and then applying heat.

According to another aspect of the present disclosure, in the ultrasound horn, the longitudinal vibration generator can comprise: a casing which is a quadrangular frame element extending in the front-and-rear direction, and which has an opening which penetrates through in the up-and-down direction, which extends in the front-and-rear direction, and to which the first layered element is attached such that the direction of layering is along the front-and-rear direction; and a pressure application wedge which is attached between an end surface, in the front-and-rear direction, of the opening and the first layered element, and which applies a pressure in the thickness direction to the plurality of first piezoelectric elements.

In this manner, the longitudinal vibration generator can be formed with a simple structure.

According to another aspect of the present disclosure, in the ultrasound horn, in the first layered element, other electrode plates can be layered at respective ends and between the first piezoelectric elements, a plurality of the other electrode plates can be alternately connected to an output terminal and a ground terminal of another high-frequency power supply toward a direction of layering, and the first piezoelectric elements can be layered in such a manner that directions of polarization are alternately reversed.

When the first piezoelectric element and the high-frequency power supply are connected in the manner described above, directions of flow of currents of the high-frequency power applied to two first piezoelectric elements adjacent to each other with the electrode plate therebetween are opposite from each other. In addition, the directions of polarization of the two adjacent first piezoelectric elements are opposite from each other. Because of this, the two first piezoelectric elements deform in a similar manner in the thickness direction. With this configuration, a vibration in the front-and-rear direction is generated by the longitudinal vibration generator.

According to an aspect of the present disclosure, there is provided an ultrasonic horn which vibrates a bonding tool attached to a tip of the horn in a plurality of directions, having a simple structure.

BRIEF DESCRIPTION OF DRAWINGS

Embodiment(s) of the present disclosure will be described based on the following figures, wherein.

DESCRIPTION OF EMBODIMENTS

An ultrasound horn 100 according to an embodiment of the present disclosure will now be described with reference to the drawings. An ultrasound horn 100 shown in FIG. 1 is a device which is provided to a wire bonding apparatus and which performs wire bonding.

Figure 1:
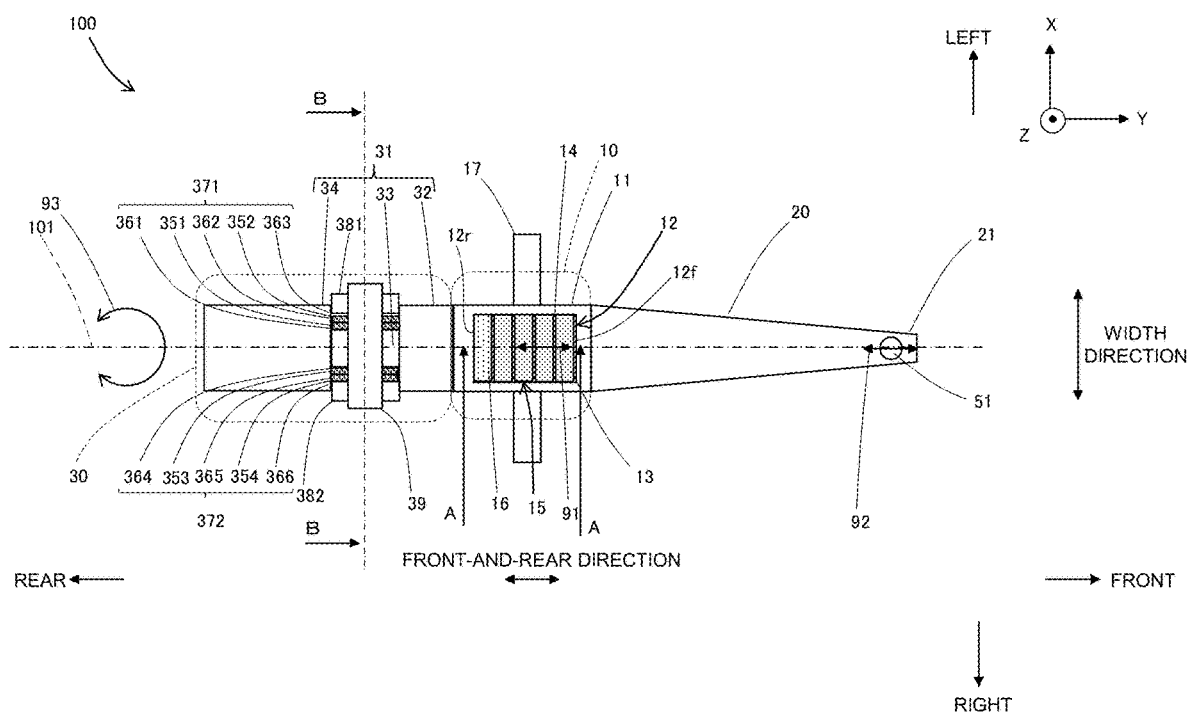
FIG. 1 is a plan view showing an ultrasound horn according to an embodiment of the present disclosure.

As shown in FIG. 1, the ultrasound horn 100 of the present embodiment comprises a longitudinal vibration generator 10, a horn portion 20, and a torsional vibration generator 30. In the following description, a direction of extension of a center axis 101 in a longitudinal direction of the ultrasound horn 100 will be referred to as a Y direction or a front-and-rear direction; a direction at a right angle to the Y direction within a horizontal plane will be referred to as an X direction or a width direction; and an up-and-down direction will be referred to as a Z direction. Further, a side of the horn portion 20 will be referred to as a front side or a positive side in the Y direction, and a side of the torsional vibration generator 30 will be referred to as a rear direction or a negative side in the Y direction. The center axis 101 is a virtual axis. In addition, a right side with respect to the positive side in the Y direction will be referred to as a right side of the ultrasound horn 100, and a side opposite from the right side will be referred to as a left side.

The longitudinal vibration generator 10 comprises a casing 11, a first layered element 15, and a pressure application wedge 16.

Figure 2:
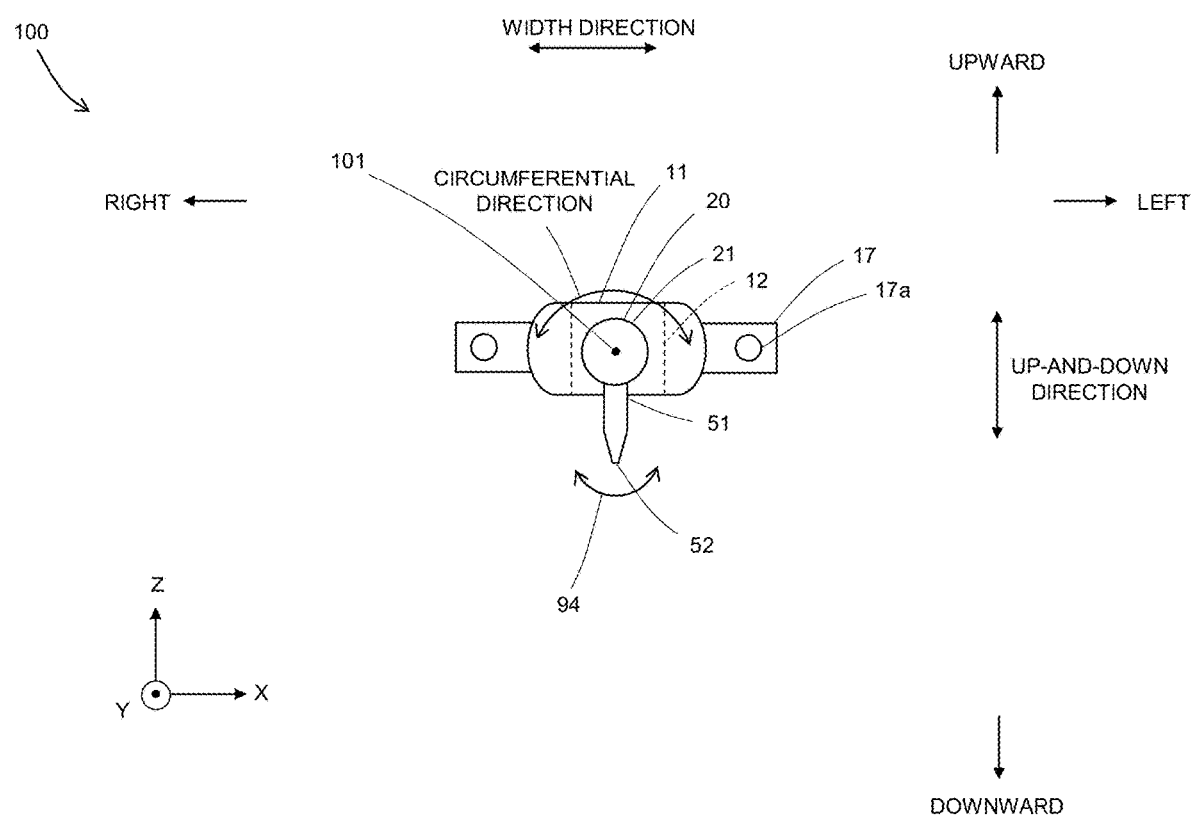
FIG. 2 is an elevation view of the ultrasound horn according to the embodiment of the present disclosure, viewed from a front end side.

As shown in FIGS. 1 and 2, the casing 11 is a quadrangular frame element which is made of a metal such as titanium, and which extends in the front-and-rear direction, and an opening 12 is formed at a center part of the casing 11, which penetrates through in the up-and-down direction, and which extends in the front-and-rear direction. In addition, on left and right outer side surfaces of the casing 11, mounting flanges 17 are provided which extend respectively in a positive side in the X direction and in a negative side in the X direction. On each of the mounting flanges 17, a bolt hole 17a is provided for fixing the ultrasound horn 100 on the wire bonding apparatus. In the opening 12, the first layered element 15 is attached in which a plurality of first piezoelectric element 13 are layered. Electrode plates 14 are respectively layered at respective ends of the first layered element 15 and between the first piezoelectric elements 13. In addition, the pressure application wedge 16 is attached between a rear end surface 12r of the opening 12 and a rear surface of the first layered element 15, for applying pressure in a thickness direction to a plurality of the first piezoelectric elements 13.

The horn portion 20 is a portion which extends from the casing 11 of the longitudinal vibration generator 10 toward the front side, and which amplifies an ultrasound vibration in the front-and-rear direction, generated by the longitudinal vibration generator 10. The horn portion 20 is integrally formed with the casing 11 of the longitudinal vibration generator 10 and is made of the metal, and has a width or a diameter narrowing from a root portion connected to a front end of the casing 11 toward a front end portion 21. As shown in FIG. 2, at the front end portion 21 of the horn portion 20, a capillary 51 which is a bonding tool is attached.

The torsional vibration generator 30 comprises a body 31 formed from a connection portion 32 which is connected to a rear end of the casing 11 of the longitudinal vibration generator 10, a rear end portion 34, and a polygonal pillar portion 33 provided between the connection portion 32 and the rear end portion 34 and having a quadrangular cross section, second layered elements 371 and 372 respectively attached to left and right side surfaces 331 and 332 of the polygonal pillar portion 33 of the body 31, weights 381 and 382 respectively attached at outer sides in the width direction of the second layered elements 371 and 372, and a pressure application ring 39. Here, the left and right side surfaces 331 and 332 are surfaces placed at positions symmetric in the width direction.

Next, with reference to FIG. 3, a detailed structure of the longitudinal vibration generator 10 will be described. As described above with reference to FIG. 1, in the opening 12 of the casing 11, the first layered element 15 is attached, and the pressure application wedge 16 is attached between the rear end surface 12r of the opening 12 and the rear end surface of the first layered element 15.

The first layered element 15 comprises the first piezoelectric element 13 of a plate form which deforms in a thickness direction when a voltage is applied, and electrode plates 14a and 14b layered between the first piezoelectric elements and at respective ends.

The first piezoelectric elements 13 of the first layered element 15 are layered in such a manner that directions of polarization P1 shown by a solid-white arrow in the figure are alternately reversed. Here, the direction of polarization P1 is a direction of a negative-side potential to a positive-side potential in the first piezoelectric element 13. As shown in FIG. 3, a first piezoelectric element 13 of a front-most position and a first piezoelectric element 13 of a second position from the front side are layered with the electrode plate 14a therebetween such that the first piezoelectric element 13 of the front-most position has the direction of polarization P1 of a positive side in the Y direction, and the first piezoelectric element 13 at the second position has the direction of polarization P1 of a negative side in the Y direction. Similarly, the first piezoelectric element 13 at the second position and a first piezoelectric element 13 at a third position from the front side are layered with the electrode plate 14b therebetween such that the first piezoelectric element 13 at the third position has the direction of polarization P1 is in the positive side in the Y direction, opposite from the direction of polarization P1 of the first piezoelectric element 13 at the second position. In this manner, the first piezoelectric elements 13 are layered with the electrode plates 14a and 14b therebetween, in such a manner that the directions of polarization P1 are alternately reversed.

The electrode plate 14b layered on the side of the direction of polarization P1 of the first piezoelectric element 13 is connected to a ground terminal 41G of a first high-frequency power supply 41, and the electrode plate 14a layered on the side opposite from the direction of polarization P1 of the first piezoelectric element 13 is connected to an output terminal 41P of the first high-frequency power supply 41. In this manner, the plurality of electrode plates 14a and 14b are alternately connected to the output terminal 41P and the ground terminal 41G of the first high-frequency power supply 41 toward the direction of layering. When a voltage of the output terminal 41P is positive, a potential of the electrode plate 14a becomes higher than a potential of the electrode plate 14b, and, when the voltage of the output terminal 41P is negative, the potential of the electrode plate 14a becomes lower than the potential of the electrode plate 14b.

Figure 3:
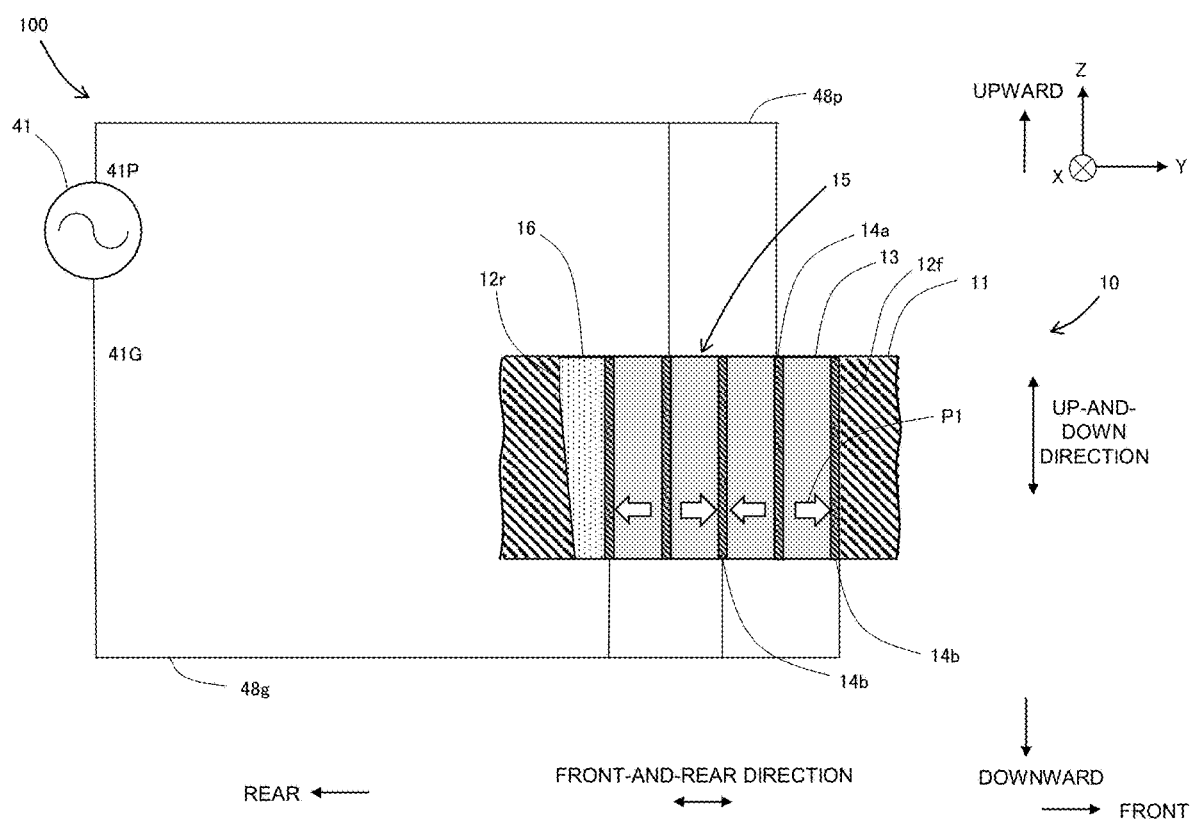
FIG. 3 is a diagram showing an A-A cross section of FIG. 1, and showing a cross section of a longitudinal vibration generator of the ultrasound horn.

As shown in FIG. 3, the rear end surface 12r of the opening 12 is inclined toward the front side, from an upper position toward a lower position. A rear surface of the pressure application wedge 16 has a same inclination surface as the rear end surfaced 12r. When the pressure application wedge 16 is inserted between the rear end surface 12r of the opening 12 and the rear end surface of the first layered element 15, the pressure application wedge 16 presses the first layered element 15 against a front surface 12f of the opening 12, and applies a pressure to the first piezoelectric element 13 in the thickness direction.

Figure 4:
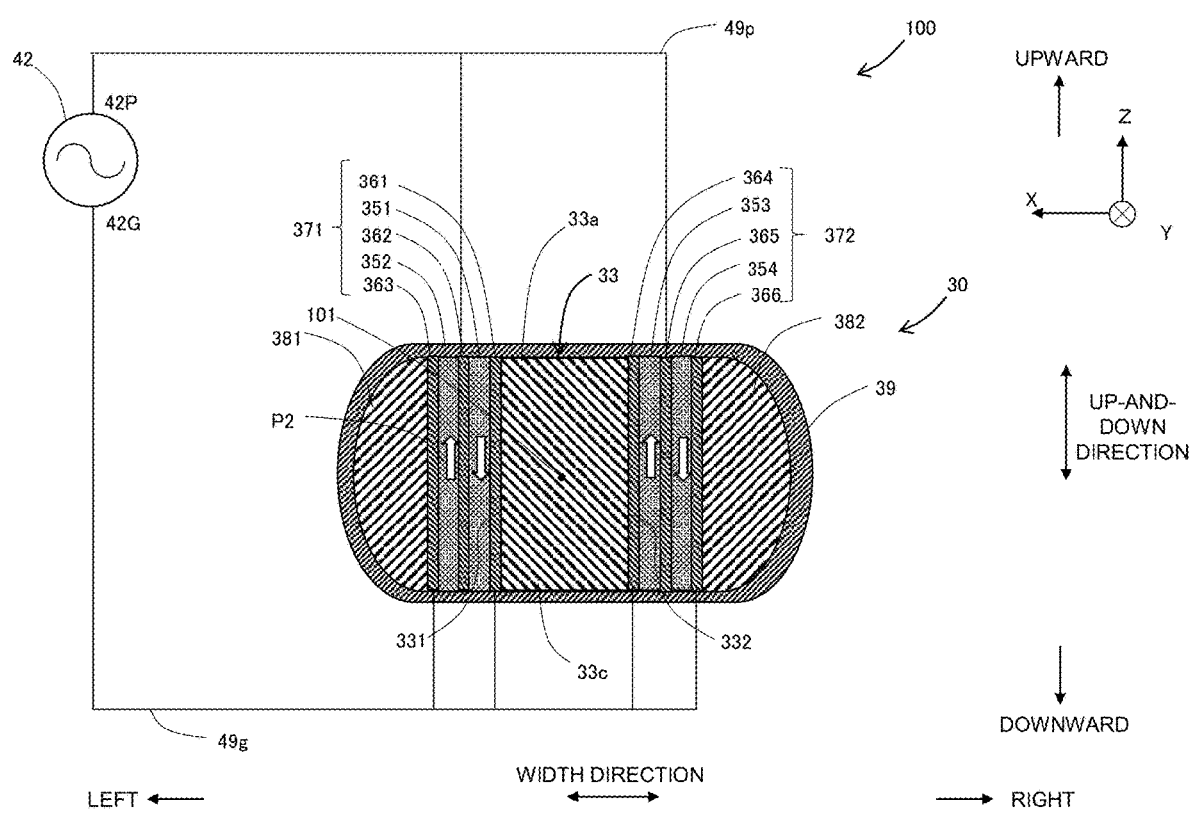
FIG. 4 is a diagram showing a B-B cross section of FIG. 1, and showing a cross section of a torsional vibration generator of the ultrasound horn.

Next, with reference to FIG. 4, details of the torsional vibration generator 30 will be described. As described above, the torsional vibration generator 30 comprises the body 31 including the polygonal pillar portion 33, the second layered elements 371 and 372, the weights 381 and 382, and the pressure application ring 39.

The polygonal pillar portion 33 of the body 31 is a portion with a quadrangular pillar shape cross section placed at a center of the body 31 in the front-and-rear direction, and comprises an upper surface 33a, a lower surface 33c, the left side surface 331, and the right side surface 332. On the left side surface 331 of the polygonal pillar portion 33, the second layered element 371 of the left side in which second piezoelectric elements 351 and 352 are layered is attached. Similarly, on the right side surface 332 of the polygonal pillar portion 33, the second layered element 372 in which second piezoelectric elements 353 and 354 are layered is attached.

The second layered element 371 of the left side is formed from a plurality of the second piezoelectric elements 351 and 352 of a plate form, which shear-deform in the up-and-down direction when a voltage is applied, and electrode plates 361~363 layered between the second piezoelectric elements 351 and 352, and at respective ends. Similarly, the second layered element 372 of the right side is formed from a plurality of the second piezoelectric elements 353 and 354 of the plate form which shear-deform in the up-and-down direction when a voltage is applied, and electrode plates 364~366 layered between the second piezoelectric elements 353 and 354 and on respective ends.

The second piezoelectric elements 351 and 352 of the second layered element 371 at the left are layered in such a manner that directions of polarization P2 shown by a solid-white arrow in the figure are opposite in the up-and-down direction. Here, the direction of polarization P2 is in a direction of a negative-side potential to a positive-side potential in the second piezoelectric elements 351 and 352, similar to the direction of polarization P1. As shown in FIG. 4, the second piezoelectric element 351 at an inner side in the second layered element 371 at the left and the second piezoelectric element 352 at an outer side are layered such that the direction of polarization P2 of the second piezoelectric element 351 is downward and the direction of polarization P2 of the second piezoelectric element 352 is upward. Similarly, the second piezoelectric element 353 at an inner side in the second layered element 372 at the right and the second piezoelectric element 354 at an outer side are layered such that the direction of polarization P2 of the second piezoelectric element 353 is upward and the direction of polarization P2 of the second piezoelectric element 354 is downward.

Therefore, the directions of polarization of the second piezoelectric elements 351 and 353 at the inner sides, which are placed at symmetric positions in the width direction with respect to the polygonal pillar portion 33, are opposite directions in the up-and-down direction, such as the downward direction for the left side and the upward direction for the right side. Similarly, the directions of polarization of the second piezoelectric elements 352 and 354 at the outer sides are opposite directions in the up-and-down direction, such as the upward direction for the left side and the downward direction for the right side. Therefore, the second layered elements 371 and 372 at the left and the right are attached to the respective side surfaces 331 and 332 of the polygonal pillar portion 33 in such a manner that the directions of polarization of the second piezoelectric elements 351~354 placed at symmetric positions in the width direction with respect to the polygonal pillar portion 33 are opposite in the up-and-down direction.

The second layered elements 371 and 372 can be layered after inverting the same piezoelectric elements, so that the directions of polarization P2 are opposite directions, or can be layered by layering two types of piezoelectric elements having different directions of polarization P2, so that the directions of polarization P2 are opposite directions.

Between the second piezoelectric elements 351 and 352 of the second layered element 371 at the left, the electrode plate 362 connected to an output terminal 42P of a second high-frequency power supply 42 is layered. Here, the second high-frequency power supply 42 is a high-frequency power supply separate from the first high-frequency power supply 41 which has already been described. In addition, the electrode plates 361 and 363 connected to a ground terminal 42G of the second high-frequency power supply 42 are layered at respective ends. In this manner, the electrode plates 361 and 363, and the electrode plate 362 are layered on respective ends of the second layered element 371 at the left and between the second piezoelectric elements 351 and 352, and are alternately connected to the output terminal 42P and the ground terminal 42G of the second high-frequency power supply 42 toward the direction of layering.

Similarly, the electrode plate 365 connected to the output terminal 42P of the second high-frequency power supply 42 is layered between the second piezoelectric elements 353 and 354 of the second layered element 372 at the right. In addition, the electrode plates 364 and 366 connected to the ground terminal 42G of the second high-frequency power supply 42 are layered at respective ends. In this manner, the electrode plates 364 and 366 and the electrode plate 365 are layered at respective ends of the second layered element 372 at the right and between the second piezoelectric elements 353 and 354, and are alternately connected to the output terminal 42P and the ground terminal 42G of the second high-frequency power supply 42 toward the direction of layering.

In this manner, the electrode plates 362 and 365 placed at symmetric positions in the width direction with respect to the polygonal pillar portion 33 are connected to the output terminal 42P of the second high-frequency power supply 42, and the electrode plates 361 and 364 and the electrode plates 363 and 366 which are respectively placed at symmetric positions in the width direction with respect to the polygonal pillar portion 33 are connected to the ground terminal 42G of the second high-frequency power supply 42. In other words, the electrode plates 362 and 365, the electrode plates 361 and 364, and the electrode plates 363 and 366 which are respectively placed at symmetric positions in the width direction with respect to the polygonal pillar portion 33 are respectively connected to the same terminals of the second high-frequency power supply 42.

On outer sides, in the width direction, of the second layered elements 371 and 372 at the left and the right, the weights 381 and 382 at left and at right are respectively attached. The pressure application ring 39 is attached in a manner to surround outer circumferences of the weights 381 and 382 at the left and the right, the second layered elements 371 and 372 at the left and the right, and the upper surface 33a and the lower surface 33c of the polygonal pillar portion 33. The pressure application ring 39 is formed from a shape memory alloy which contracts when heat is applied. The pressure application ring 39 can be, for example, a shape memory alloy having nickel and titanium as primary components. The pressure application ring 39 has a circumferential length before heating which is longer than circumferential lengths of the outer circumferences of the weights 381 and 382 at the left and at the right, the second layered elements 371 and 372 at the left and at the right, and the upper surface 33a and the lower surface 33c of the polygonal pillar portion 33. The pressure application ring 39 is fitted from a rear end side to surround the outer circumferences of these portions. When the ring is heated, the ring contracts, so that the ring presses the second piezoelectric elements 351~354 at the left and at the right to the left and right side surfaces 331 and 332 of the polygonal pillar portion 33 via the weights 381 and 382, and applies pressure in the thickness direction to the second piezoelectric elements 351~354 layered on the left and right side surfaces 331 and 332.

Figure 5:
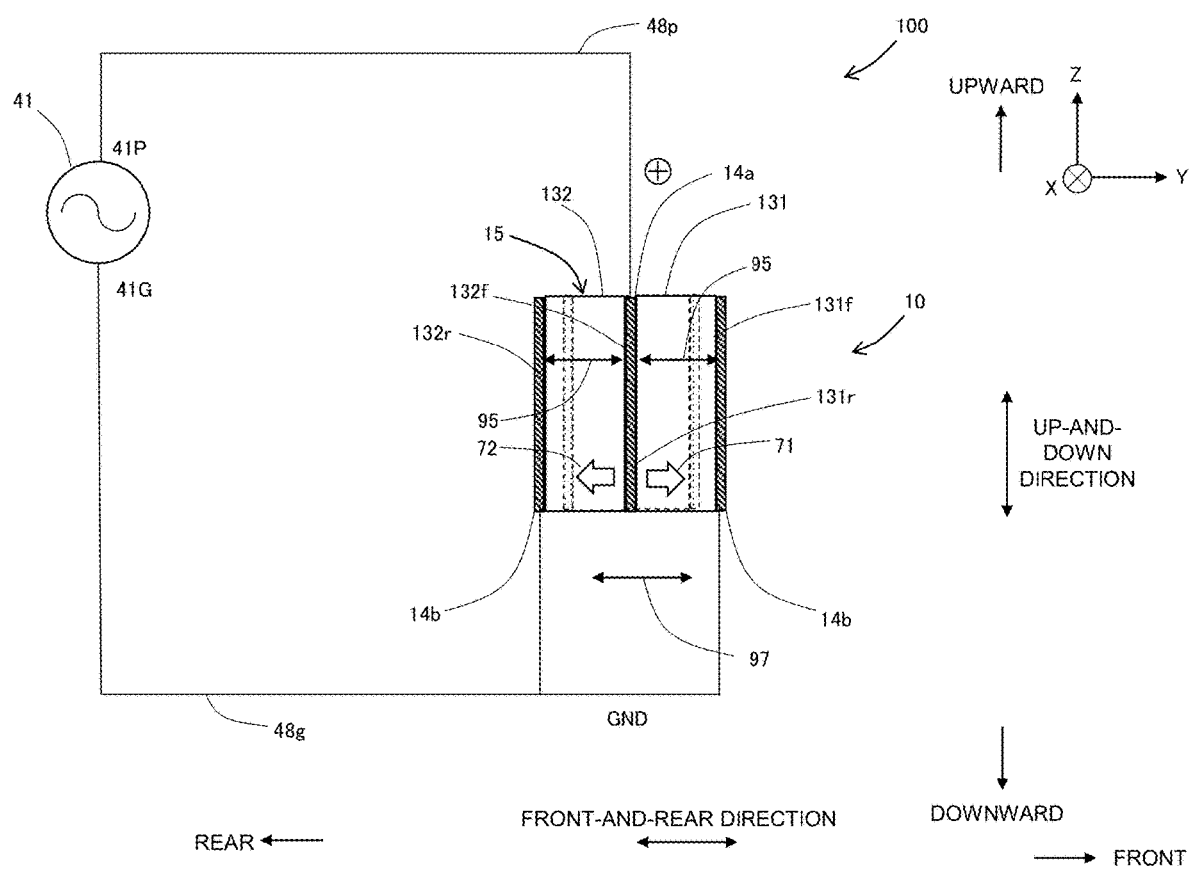
FIG. 5 is an explanatory diagram showing an operation of a longitudinal vibration generator.
Figure 6:
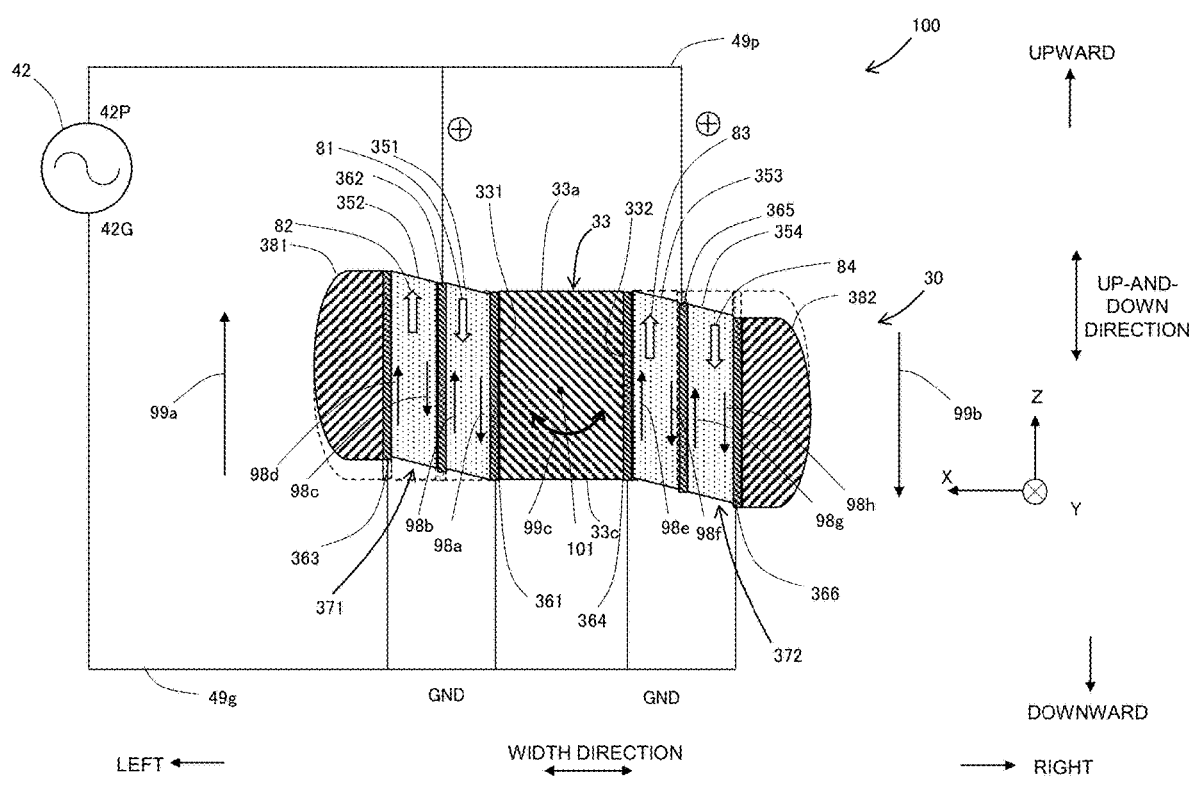
FIG. 6 is an explanatory diagram showing an operation of a torsional vibration generator.

Next, an operation when a high-frequency power is applied to the ultrasound horn 100 formed in the above-described configuration will be described with reference to FIGS. 5 and 6. In FIGS. 5 and 6, a broken line shows the longitudinal vibration generator 10 and the torsional vibration generator 30 when the high-frequency power is not applied. First, with reference to FIG. 5, an operation of the longitudinal vibration generator 10 will be described. FIG. 5 is a diagram extracting a part of the first layered element 15 in which two first piezoelectric elements 131 and 132, the electrode plate 14a, and two electrode plates 14b are layered.

As shown in FIG. 5, when a potential of the output terminal 41P of the first high-frequency power supply 41 is positive, a current flows from the electrode plate 14a connected to the output terminal 41P to the electrode plate 14b connected to the ground terminal 41G. Because of this, the current flows in the direction of polarization shown by a solid-white arrow 71, from a rear surface 131r of the first piezoelectric element 131 at the front side toward a front surface 131f. With this process, the first piezoelectric element 131 at the front side deforms in a manner that the thickness is thickened, as shown by an arrow 95. Similarly, in the first piezoelectric element 132 at the rear side, the current flows in the direction of polarization shown by a solid-white arrow 72, from a front surface 132f which is in contact with the electrode plate 14a toward a rear surface 132r. With this process, the first piezoelectric element 132 at the rear side also deforms in a manner that the thickness is thickened, as shown by the arrow 95. When the potential of the output terminal 41P of the first high-frequency power supply 41 becomes negative, a reverse process takes place, and the first piezoelectric element 131 at the front side and the first piezoelectric element 132 at the rear side deform in a manner that the thickness is reduced.

In this manner, when the high-frequency power is applied from the first high-frequency power supply 41 to the longitudinal vibration generator 10, the plurality of first piezoelectric elements 13 of the first layered element 15 repeatedly deform to simultaneously increase or decrease the thickness. With this fluctuation of the thickness, an ultrasound vibration in the front-and-rear direction is generated. The ultrasound vibration is amplified by the horn portion 20, and vibrates a tip of the capillary 51 attached to the tip of the horn portion 20 in the Y direction or in the front-and-rear direction, as shown by an arrow 92 in FIG. 1.

Next, with reference to FIG. 6, an operation of the torsional vibration generator 30 will be described. Similar to the longitudinal vibration generator 10 described above, a case will be described in which a potential of the output terminal 42P of the second high-frequency power supply 42 is positive. In the second piezoelectric element 351 at the inner side of the second layered element 371 attached to the left side of the polygonal pillar portion 33, the current flows in a right direction, from the electrode plate 362 connected to the output terminal 42P toward the electrode plate 361 placed at the inner side and connected to the ground terminal 42G. In this process, the second piezoelectric element 351 at the inner side shear-deforms in a manner such that the right side deforms in the downward direction as shown by an arrow 98a and the left side deforms in the upward direction as shown by an arrow 98b. In contrast, in the second piezoelectric element 352 placed at the outer side, the current flows in a left direction, opposite to the direction of current in the second piezoelectric element 351, from the electrode plate 362 toward the electrode plate 363 at the outer side, placed at the outer side and connected to the ground terminal 42G. The direction of polarization of the second piezoelectric element 352 at the outer side is upward, as shown by a solid-white arrow 82, and is opposite from the direction of polarization of the second piezoelectric element 351 at the inner side, shown by a solid-white arrow 81. Thus, similar to the second piezoelectric element 351, the second piezoelectric element 352 at the outer side shear-deforms in such a manner that a right side which is in contact with the electrode plate 361 at the inner side deforms in the downward direction, as shown by an arrow 98c and a left side which is in contact with the electrode plate 363 at the outer side deforms in the upward direction, as shown by an arrow 98d. In this manner, because the direction of polarization of the second piezoelectric element 352 at the outer side is opposite from the direction of polarization of the second piezoelectric element 351, and the directions of flow of current are also opposite from each other, the second piezoelectric element 352 at the outer side shear-deforms in a direction similar to that of the second piezoelectric element 351 at the inner side. Therefore, when the potential of the output terminal 42P of the second high-frequency power supply 42 is positive, the second piezoelectric element 351 at the inner side and the second piezoelectric element 352 at the outer side shear-deform in a manner that the left side deforms in the upward direction. With the shear deformation, the second piezoelectric elements 351 and 352 move the weight 381 at the left in the upward direction.

Incidentally, in the second piezoelectric element 353 at the inner side of the second layered element 372 attached to the inner side at the right side of the polygonal pillar portion 33, the current flows in the left direction similar to the second piezoelectric element 352 at the outer side and at the left, from the electrode plate 365 toward the electrode plate 364. In this process, similar to the second piezoelectric element 352 at the outer side and at the left, because the direction of polarization of the second piezoelectric element 353 at the inner side, shown by a solid-white arrow 83, is the upward direction, similar to the second piezoelectric element 352 at the left, the second piezoelectric element 353 shear-deforms in a manner that a left side deforms in the upward direction, as shown by an arrow 98e, and a right side deforms in the downward direction, as shown by an arrow 98f. In the second piezoelectric element 354 at the outer side, the current flows in the right direction similar to the second piezoelectric element 351 at the inner side at the left, from the electrode plate 365 toward the electrode plate 366. In the second piezoelectric element 354 at the outer side at the right, similar to the second piezoelectric element 351 at the inner side at the left, because the direction of polarization shown by a solid-white arrow 84 is the downward direction, similar to the second piezoelectric element 351 at the left, the second piezoelectric element 354 shear-deforms in such a manner that a left side deforms in the upward direction, as shown by an arrow 98g, and a right side deforms in the downward direction, as shown by an arrow 98h. Because of this, when the potential of the output terminal 42P of the second high-frequency power supply 42 is positive, the second piezoelectric element 353 at the inner side and the second piezoelectric element 354 at the outer side shear-deform in such a manner that the right side, which is the outer side, deforms in the downward direction. With the shear deformation, the second piezoelectric elements 353 and 354 move the weight 382 at the right in the downward direction.

As described, when the potential of the output terminal 42P of the second high-frequency power supply 42 is positive, the second piezoelectric elements 351 and 352 at the left shear-deform with the left side deforming in the upward direction, and move the weight 381 at the left upward. In contrast, when the potential of the output terminal 42P of the second high-frequency power supply 42 is positive, the second piezoelectric elements 353 and 354 at the right shear-deform with the right side deforming downward, and move the weight 382 at the right downward. With this process, a clockwise torque is generated in the polygonal pillar portion 33 of the body 31. When the potential of the output terminal 42P of the second high-frequency power supply 42 becomes negative, a reverse process takes place, the second piezoelectric elements 351 and 352 at the left shear-deform with the left side deforming downward and move the weight 381 at the left downward, and the second piezoelectric elements 353 and 354 at the right shear-deform with the right side deforming upward and move the weight 382 at the right upward. With this process, a counterclockwise torque is generated in the polygonal pillar portion 33 of the body 31. The torsional vibration generator 30 thus generates a torsional vibration as shown by an arrow 94 in FIG. 2, around the center axis 101 in the longitudinal direction of the ultrasound horn 100. With this torsional vibration, the tip of the capillary 51 attached at the tip of the horn portion 20 is vibrated in the X direction or the width direction.

When the second piezoelectric elements 351 and 352 at the left and the second high-frequency power supply 42 are connected in the manner described above, the directions of the flow, in the width direction, of the currents of the high-frequency power applied to the two second piezoelectric elements 351 and 352 adjacent to each other with the electrode plate 362 therebetween is set to opposite directions. In contrast, the directions of polarization of the two adjacent second piezoelectric elements 351 and 352 are opposite in the up-and-down direction. Thus, currents of the opposite directions flow in the two second piezoelectric elements 351 and 352 having opposite directions of polarization. As a result, the two second piezoelectric elements 351 and 352 integrally shear-deform in the same direction in the up-and-down direction. This is similarly applicable to the second piezoelectric elements 353 and 354 at the right, and the second layered element 372.

Further, the second layered element 371 at the left and the second layered element 372 at the right are attached respectively to the left and right side surfaces 331 and 332 of the polygonal pillar portion 33 in such a manner that the directions of polarization of the second piezoelectric elements 351 and 353, and the second piezoelectric elements 352 and 354, which are respectively placed at symmetric positions in the width direction with respect to the polygonal pillar portion 33, are opposite in the up-and-down direction. In contrast, the electrode plates 362 and 365, the electrode plates 361 and 364, and the electrode plates 363 and 366, are respectively connected to the second high-frequency power supply 42 in such a manner that the directions of flow of the currents of the second layered elements 371 and 372 at the left and the right are symmetric with respect to the polygonal pillar portion 33. As already described, the directions of polarization of the second piezoelectric elements 351 and 353, and the second piezoelectric elements 352 and 354 respectively placed at symmetric positions in the width direction with respect to the polygonal pillar portion 33 are opposite directions in the up-and-down direction. Because of this, the directions of the shear deformation of the second piezoelectric elements 351 and 353, and the second piezoelectric elements 352 and 354, which are respectively placed at symmetric positions in the width direction with respect to the polygonal pillar portion 33, are opposite directions in the up-and-down direction. With this configuration, when the high-frequency power is applied to the second layered elements 371 and 372, the second layered elements 371 and 372 at the left and the right of the polygonal pillar portion 33 shear-deform in opposite directions in the up-and-down direction, and respectively move the weights 381 and 382 in opposite directions in the up-and-down direction. Thus, a torsional moment can be applied to the polygonal pillar portion 33, and the polygonal pillar portion 33 can be torsionally vibrated.

As described, the ultrasound horn 100 vibrates the capillary 51 attached at the tip in the XY directions with a simple structure.

Next, with reference to FIGS. 7 and 8, an ultrasound horn 200 of another embodiment of the present disclosure will be described. Components similar to those of the ultrasound horn 100 described above with reference to FIGS. 1 to 6 are assigned the same reference numerals, and will not be repeatedly described.

Figure 7:
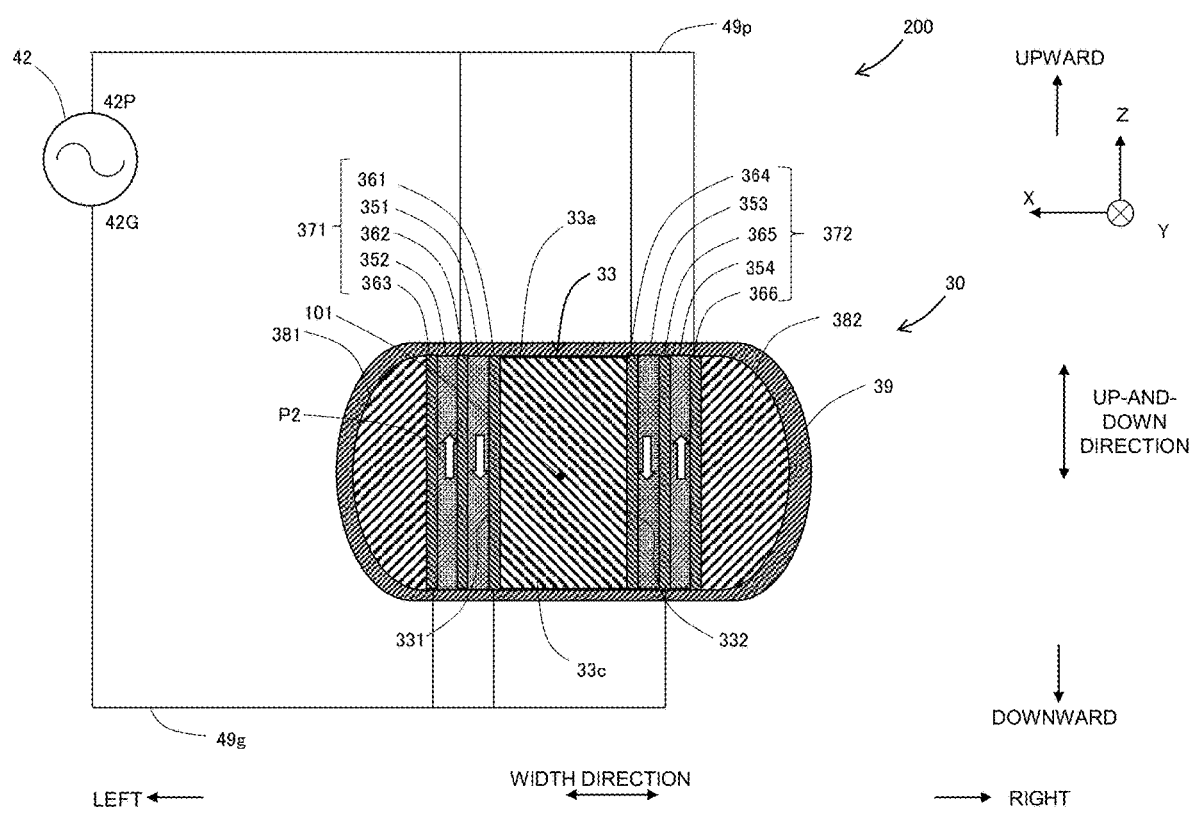
FIG. 7 is a diagram showing a cross section of a torsional vibration generator of an ultrasound horn according to another embodiment of the present disclosure.

As shown in FIG. 7, in the ultrasound horn 200, the direction of polarization of the second piezoelectric element 353 at the inner side of the second layered element 372 at the right is set to downward, the direction of polarization of the second piezoelectric element 354 at the outer side is set to upward, the electrode plate 365 layered between the second piezoelectric elements 353 and 354 is connected to the ground terminal 42G of the second high-frequency power supply 42, and the electrode plates 364 and 366 layered at respective ends of the second layered element 372 are connected to the output terminal 42P of the second high-frequency power supply 42.

Thus, in the ultrasound horn 200, the second layered elements 371 and 372 are attached respectively to the left and right side surfaces 331 and 332 of the polygonal pillar portion 33 such that the directions of polarization of the second piezoelectric elements 351 and 353, and the second piezoelectric elements 352 and 354, which are placed at symmetric positions in the width direction with respect to the polygonal pillar portion 33, are respectively the same direction. Moreover, the electrode plates 361 and 364, the electrode plates 362 and 365, and the electrode plates 363 and 366, which are respectively placed at symmetric positions in the width direction with respect to the polygonal pillar portion 33, are respectively connected to different terminals of the second high-frequency power supply 42; that is, one connected to the output terminal 42P and the other connected to the ground terminal 42G. The other structures are identical to those of the ultrasound horn 100 which has already been described.

Figure 8:
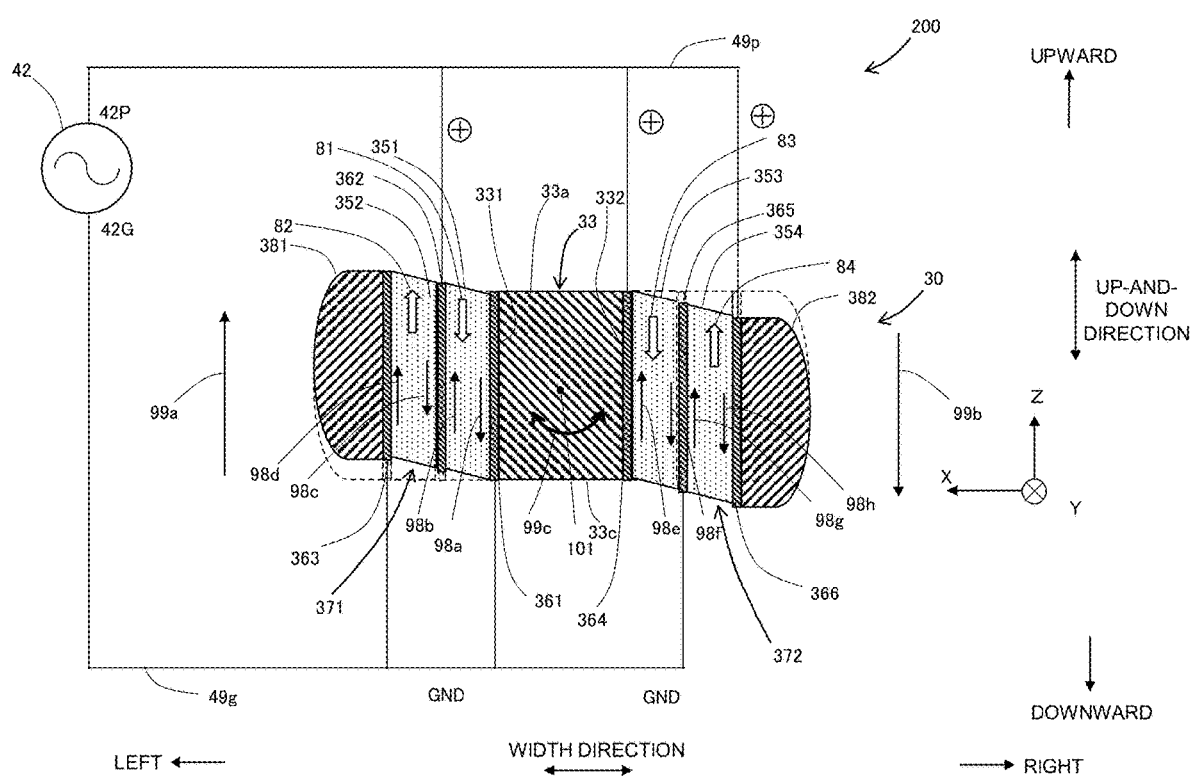
FIG. 8 is an explanatory diagram showing an operation of the torsional vibration generator shown in FIG. 7.

With reference to FIG. 8, an operation of the ultrasound horn 200 when the potential of the output terminal 42P of the second high-frequency power supply 42 is positive will be described. As a displacement of the second layered element 371 at the left is identical to that in the ultrasound horn 100 described above, this displacement will not be repeatedly described.

As shown in FIG. 8, when the potential of the output terminal 42P of the second high-frequency power supply 42 is positive, in the second piezoelectric element 353 at the inner side at the right, a current flows in the rightward direction from the electrode plate 364 toward the electrode plate 365, and the direction of polarization is downward. The direction of flow of the current and the direction of polarization are similar to those of the second piezoelectric element 351 at the left. Therefore, similar to the second piezoelectric element 351 at the left, the second piezoelectric element 353 at the inner side at the right shear-deforms in a such manner that a right side deforms in the downward direction and the left side deforms in the upward direction, as shown by arrows 98e and 98f. Similarly, as the direction of current flowing in the second piezoelectric element 354 at the left and the direction of polarization are similar to those of the second piezoelectric element 352 at the left, similar to the second piezoelectric element 352 at the left, the second piezoelectric element 354 at the right shear-deforms in a manner that the right side deforms in the downward direction and the left side deforms in the upward direction, as shown by arrows 98g and 98h.

In this manner, in the ultrasound horn 200, similar to the ultrasound horn 100, when the potential of the output terminal 42P of the second high-frequency power supply 42 is positive, the second piezoelectric element 353 at the inner side and the second piezoelectric element 354 at the outer side shear-deform with the right side which is the outer side deforming downward. With the shear deformation, the second piezoelectric elements 353 and 354 move the weight 382 at the right downward.

With this process, similar to the ultrasound horn 100, when the high-frequency power is applied to the second layered elements 371 and 372, the second layered elements 371 and 372 at the left and right of the polygonal pillar portion 33 shear-deform in opposite directions in the up-and-down direction, and move the weights 381 and 382 in opposite directions in the up-and-down direction. Thus, a torsional moment can be applied to the polygonal pillar portion 33, and the polygonal pillar portion 33 can be torsionally vibrated.

The ultrasound horn 200 has similar effects and advantages as those of the ultrasound horn 100.

Next, with reference to FIG. 9, an ultrasound horn 300 according to another embodiment of the present disclosure will be described. Components identical to those of the ultrasound horn 100 and the ultrasound horn 200 described above with reference to FIGS. 1 to 8 are assigned the same reference numerals and will not be repeatedly described.

Figure 9:
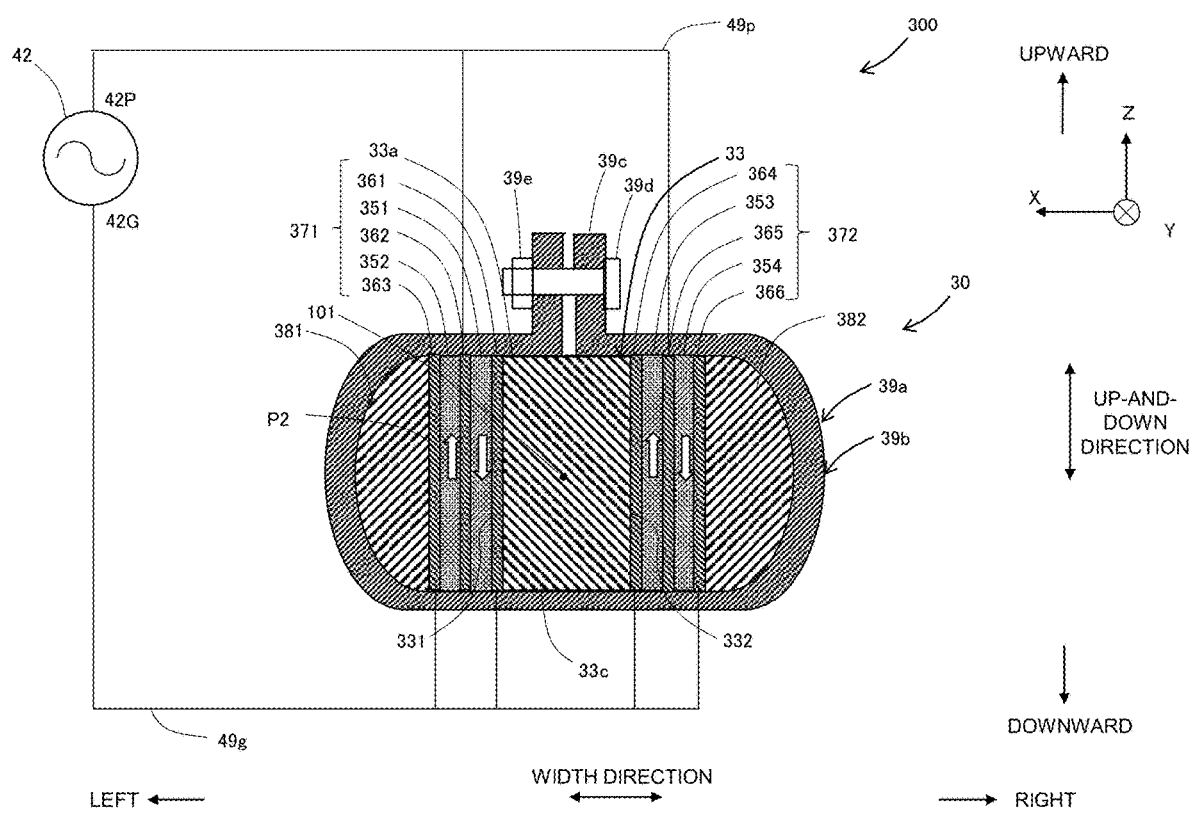
FIG. 9 is a diagram showing a cross section of a torsional vibration generator of an ultrasound horn according to another embodiment of the present disclosure.

In the ultrasound horn 300 shown in FIG. 9, in place of the pressure application ring 39 formed from the shape memory alloy of the ultrasound horns 100 and 200 described above, a clamp-type pressure application ring 39a is used to apply the pressure in the thickness direction to the second piezoelectric elements 351~354 layered on the left and right side surfaces 331 and 332 of the polygonal pillar portion 33.

The clamp-type pressure application ring 39a comprises a ring portion 39b having a circular ring shape with a gap or a C-shape, two flange portions 39c protruding from the ring portion 39b toward an outer side in a radial direction on respective sides of the gap, and a bolt 39d which is inserted into holes formed in the two flange portions 39c and which fastens the two flanges 39c in the circumferential direction in cooperation with a nut 39e.

In the clamp-type pressure application ring 39a, in a state in which the bolt 39d and the nut 39e are removed, a length of an inner circumference of the ring portion 39b is longer than lengths of outer circumferences of the weights 381 and 382 at the left and the right, the second layered elements 371 and 372 at the left and the right, and the upper surface 33a and the lower surface 33c of the polygonal pillar portion 33. When the pressure is to be applied to the second piezoelectric elements 351~354 with the clamp-type pressure application ring 39a, the bolt 39d and the nut 39e are removed, so that the length of the inner circumference of the ring portion 39b is longer than the lengths of the outer circumferences of the weights 381 and 382 at the left and the right, the second layered elements 371 and 372 at the left and the right, and the upper surface 33a and the lower surface 33c of the polygonal pillar portion 33, and the ring portion 39b is fitted from a rear end side to surround the outer circumferences of these portions. The bolt 39d is passed through the holes of the two flange portions 39c and the nut 39e is fastened from the opposite side, to reduce the gap between the two flange portions 39c. With this configuration, an inner surface of the ring portion 39b presses the second piezoelectric elements 351~354 at the left and the right onto the left and right side surfaces 331 and 332 of the polygonal pillar portion 33 via the weights 381 and 382. In this manner, the inner surface of the ring portion 39b applies the pressure in the thickness direction to the second piezoelectric elements 351~354 layered on the left and right side surfaces 331 and 332.

The ultrasound horn 300 applies the pressure in the thickness direction to the second piezoelectric elements 351~354 with a simple structure.

In the ultrasound horns 100, 200, and 300 described above, a structure is described in which the second layered elements 371 and 372 are attached to the left side surface 331 and the right side surface 332 of the polygonal pillar portion 33 having a quadrangular cross section, but the polygonal pillar portion 33 is not limited to the quadrangular cross section. The cross section can alternatively be any shape having the left side surface 331 and the right side surface 332 such as, for example, a hexagonal shape or an octagonal shape.

In this regard, although the ultrasound horns 100, 200, and 300 disclose a pair of the second layered elements 371 and 372, a number of the second layered elements 371 and 372 is not limited to two, and it can be one or more than two to generate reciprocating rotational movement for a torque in the ultrasound horn about the y axis in other alternative embodiments that are not illustrated but as claimed.

In addition, the weights 381 and 382 are respectively attached at outer sides in the width direction of the second layered elements 371 and 372 in the ultrasound horns 100, 200, and 300 for augmenting the torque generated by the shear-deforming second layered element 371 and 372. The torque is efficiently amplified as the weights 381 and 382 are made of heavy metal such as lead and tungsten to facilitate amplification.

On the other hand, the weights 381 and 382 are optional in certain embodiments where the polygonal pillar portion 33 extends laterally over a long distance like a long stick and the second layered elements 371 and 372 are placed near a distance end of the long stick-like polygonal pillar portion 33. Depending upon a structural configuration of the polygonal pillar portion 33, the weights 381 and 382 are placed outside or inside relative to the second layered elements 371 and 37 along the width direction of the ultrasound horns 100, 200, and 300.

The ultrasound horns 100, 200, and 300 disclose that the torsional vibration generator 30 is located in rear of the longitudinal vibration generator 10 along the front-and-rear direction in the disclosed embodiments. The relative location of the torsional vibration generator 30 and the longitudinal vibration generator 10 is not limited in other potential applications as claimed.

REFERENCE SIGNS LIST

10 LONGITUDINAL VIBRATION GENERATOR; 11 CASING; 12 OPENING; 12f FRONT SURFACE; 12r REAR END SURFACE; 13, 131, 132 FIRST PIEZOELECTRIC ELEMENT; 14, 14a, 14b, 361~366 ELECTRODE PLATE; 15 FIRST LAYERED ELEMENT; 16 PRESSURE APPLICATION WEDGE; 17 MOUNTING FLANGE; 17a ATTACHMENT ARM; 17a BOLT HOLE; 20 HORN PORTION; 21 FRONT END; 30 TORSIONAL VIBRATION GENERATOR; 31 BODY; 32 CONNECTION PORTION; 33 POLYGONAL PILLAR PORTION; 33a UPPER SURFACE; 33c LOWER SURFACE; 34 REAR END; 39 PRESSURE APPLICATION RING; 39a CLAMP-TYPE PRESSURE APPLICATION RING; 39b RING PORTION; 39c FLANGE PORTION; 39d BOLT; 39e NUT; 41 FIRST HIGH-FREQUENCY POWER SUPPLY; 41G, 42G GROUND TERMINAL; 41P, 42P OUTPUT TERMINAL; 42 SECOND HIGH-FREQUENCY POWER SUPPLY; 51 CAPILLARY; 100, 200, 300 ULTRASOUND HORN; 101 CENTER AXIS; 131f, 132f FRONT SURFACE; 131r, 132r REAR SURFACE; 331 LEFT SIDE SURFACE; 332 RIGHT SIDE SURFACE; 351~354 SECOND PIEZOELECTRIC ELEMENT; 371, 372 SECOND LAYERED ELEMENT; 381, 382 WEIGHT.

The invention claimed is:

1. An ultrasound horn that is used for a bonding apparatus, the ultrasound horn comprising:
a longitudinal vibration generator inside of which a first layered element is attached, in which a plurality of first piezoelectric elements of a plate form which deform in a thickness direction when a voltage is applied are layered, and that generates an ultrasound vibration in a front-and-rear direction;
a horn portion that extends from the longitudinal vibration generator toward a front side and on a front tip of which a bonding tool is attached; and
a torsional vibration generator that extends from the longitudinal vibration generator toward a rear side, wherein
the torsional vibration generator comprises:
a body that extends from the longitudinal vibration generator toward the rear side, and that includes a polygonal pillar portion;
two second layered elements in each of which a plurality of second piezoelectric elements of a plate form which shear-deform when a voltage is applied are layered, and that are respectively attached to respective side surfaces of the polygonal pillar portion in such a manner that a direction of layering is along a width direction orthogonal to the front-and-rear direction;
weights that are respectively layered at outer sides in the width direction of the second layered elements; and
a pressure application ring that surrounds the weights, the second layered elements, and the polygonal pillar portion, and that presses the plurality of second piezoelectric elements via the weights onto the polygonal pillar portion, to thereby apply a pressure in the thickness direction to the second piezoelectric elements.

2. The ultrasound horn according to claim 1, wherein the second layered elements are attached to respective side surfaces of the polygonal pillar portion in such a manner that, when a high-frequency power is applied from a high-frequency power supply, the second layered elements shear-deform in an up-and-down direction orthogonal to the front-and-rear direction and to the width direction, and directions of the shear deformation are opposite from each other, and the second layered elements are also connected to the high-frequency power supply.

3. The ultrasound horn according to claim 2, wherein in the second layered element, electrode plates are layered at respective ends and between the second piezoelectric elements,
a plurality of the electrode plates are alternately connected to an output terminal and a ground terminal of the high-frequency power supply toward the direction of layering,
the second piezoelectric elements are layered in such a manner that directions of polarization are alternately reversed, and
the second layered elements are attached to respective side surfaces of the polygonal pillar portion in such a manner that the directions of polarization of the second piezoelectric elements placed at symmetric positions in the width direction with respect to the polygonal pillar portion are opposite in the up-and-down direction, and the electrode plates placed at symmetric positions in the width direction with respect to the polygonal pillar portion are connected to a same terminal of the high-frequency power supply.

4. The ultrasound horn according to claim 2, wherein in the second layered element, electrode plates are layered at respective ends and between the second piezoelectric elements,
a plurality of the electrode plates are alternately connected to an output terminal and a ground terminal of the high-frequency power supply toward the direction of layering, the second piezoelectric elements are layered in such a manner that directions of polarization are alternately reversed, and the second layered elements are attached to respective side surfaces of the polygonal pillar portion in such a manner that the directions of polarization of the second piezoelectric elements placed at symmetric positions in the width direction with respect to the polygonal pillar portion are identical to each other, and the electrode plates placed at symmetric positions in the width direction with respect to the polygonal pillar portion are connected to different terminals of the high-frequency power supply.

5. The ultrasound horn according to claim 1, wherein the pressure application ring is formed from a shape memory alloy which contracts when heat is applied.

6. The ultrasound horn according to claim 2, wherein the pressure application ring is formed from a shape memory alloy which contracts when heat is applied.

7. The ultrasound horn according to claim 3, wherein the pressure application ring is formed from a shape memory alloy which contracts when heat is applied.

8. The ultrasound horn according to claim 4, wherein the pressure application ring is formed from a shape memory alloy which contracts when heat is applied.

9. The ultrasound horn according to claim 1, wherein the longitudinal vibration generator comprises:

a casing which is a quadrangular frame element extending in the front-and-rear direction, and which has an opening which penetrates through in an up-and-down direction, which extends in the front-and-rear direction, and to which the first layered element is attached such that the direction of layering is along the front-and-rear direction; and a pressure application wedge which is attached between an end surface, in the front-and-rear direction, of the opening and the first layered element, and which applies a pressure in the thickness direction to the plurality of first piezoelectric elements.

10. The ultrasound horn according to claim 9, wherein in the first layered element, other electrode plates are layered at respective ends and between the first piezoelectric elements, a plurality of the other electrode plates are alternately connected to an output terminal and a ground terminal of another high-frequency power supply toward a direction of layering, and the first piezoelectric elements are layered in such a manner that directions of polarization are alternately reversed.

11. The ultrasound horn according to claim 9, wherein the pressure application ring is formed from a shape memory alloy which contracts when heat is applied.

12. The ultrasound horn according to claim 10, wherein the pressure application ring is formed from a shape memory alloy which contracts when heat is applied.

13. The ultrasound horn according to claim 2, wherein the longitudinal vibration generator comprises:

a casing which is a quadrangular frame element extending in the front-and-rear direction, and which has an opening which penetrates through in the up-and-down direction, which extends in the front-and-rear direction, and to which the first layered element is attached such that the direction of layering is along the front-and-rear direction; and a pressure application wedge which is attached between an end surface, in the front-and-rear direction, of the opening and the first layered element, and which applies a pressure in the thickness direction to the plurality of first piezoelectric elements, in the first layered element, other electrode plates are layered at respective ends and between the first piezoelectric elements, a plurality of the other electrode plates are alternately connected to an output terminal and a ground terminal of another high-frequency power supply toward a direction of layering, and the first piezoelectric elements are layered in such a manner that directions of polarization are alternately reversed.

14. The ultrasound horn according to claim 3, wherein the longitudinal vibration generator comprises:

a casing which is a quadrangular frame element extending in the front-and-rear direction, and which has an opening which penetrates through in the up-and-down direction, which extends in the front-and-rear direction, and to which the first layered element is attached such that the direction of layering is along the front-and-rear direction; and a pressure application wedge which is attached between an end surface, in the front-and-rear direction, of the opening and the first layered element, and which applies a pressure in the thickness direction to the plurality of first piezoelectric elements, in the first layered element, other electrode plates are layered at respective ends and between the first piezoelectric elements, a plurality of the other electrode plates are alternately connected to an output terminal and a ground terminal of another high-frequency power supply toward a direction of layering, and the first piezoelectric elements are layered in such a manner that directions of polarization are alternately reversed.

15. The ultrasound horn according to claim 4, wherein the longitudinal vibration generator comprises:

a casing which is a quadrangular frame element extending in the front-and-rear direction, and which has an opening which penetrates through in the up-and-down direction, which extends in the front-and-rear direction, and to which the first layered element is attached such that the direction of layering is along the front-and-rear direction; and a pressure application wedge which is attached between an end surface, in the front-and-rear direction, of the opening and the first layered element, and which applies a pressure in the thickness direction to the plurality of first piezoelectric elements, in the first layered element, other electrode plates are layered at respective ends and between the first piezoelectric elements, a plurality of the other electrode plates are alternately connected to an output terminal and a ground terminal of another high-frequency power supply toward a direction of layering, and the first piezoelectric elements are layered in such a manner that directions of polarization are alternately reversed.

16. The ultrasound horn according to claim 13, wherein the pressure application ring is formed from a shape memory alloy which contracts when heat is applied.

17. The ultrasound horn according to claim 14, wherein the pressure application ring is formed from a shape memory alloy which contracts when heat is applied.

18. The ultrasound horn according to claim 15, wherein the pressure application ring is formed from a shape memory alloy which contracts when heat is applied.

19. A bonding apparatus, comprising:
an ultrasound horn extending in a front-and-rear direction along a y axis from a rear side to a front tip in a front side, a bonding tool being attached to the front tip; and
a torsional vibration generator located along the ultrasound horn for generating torsional vibration so as to cause a torque in the ultrasound horn about the y axis, wherein the torsional vibration generator further comprises:
   a body having at least a side surface located at a predetermined distance from the y axis in a width direction along a x axis that is perpendicular to the y axis; and
   at least one second layered element located adjacent to the side surface and having at least a pair of second piezoelectric elements for shear-deforming to generate reciprocating rotational movement for the torque.

20. The bonding apparatus according to claim 19, wherein the torsional vibration generator further comprises:
   a polygonal pillar portion located in the body for providing the side surface for the second layered element; and
   a weight located near the second layered element so as to augment the torque in the ultrasound horn about the y axis as the second layered element shear-deforms.

21. The bonding apparatus according to claim 20, wherein the torsional vibration generator further comprises a pressure application ring surrounding the weights, the second layered elements, and the polygonal pillar portion for pressing the second piezoelectric elements via the weights onto the polygonal pillar portion so as to thereby apply a pressure in the thickness direction to the second piezoelectric elements.

22. The bonding apparatus according to claim 21, wherein the pressure application ring is formed from a shape memory alloy which contracts when heat is applied.

23. The bonding apparatus according to claim 21, wherein the pressure application ring is a clamp-type pressure application ring.

24. The bonding apparatus according to claim 19, wherein the ultrasound horn further comprises a longitudinal vibration generator located along the ultrasound horn including at least a first layered element having a plurality of first piezoelectric elements for deforming in a thickness direction when a voltage is applied so as to generate an ultrasound vibration to the ultrasound horn in the front-and-rear direction.

25. The bonding apparatus according to claim 24, wherein the longitudinal vibration generator further comprises a pressure application wedge having a slanted surface and located at an end surface of the first layered element for applying a pressure in the thickness direction to the plurality of first piezoelectric elements.

26. A bonding apparatus, comprising:
an ultrasound horn extending in a front-and-rear direction along a y axis from a rear side to a front tip in a front side, a bonding tool being attached to the front tip;
a longitudinal vibration generator located along the ultrasound horn including at least a first layered element having first piezoelectric elements for shear-deforming to generate reciprocating movement in the front-and-rear direction; and
a torsional vibration generator located along the ultrasound horn for generating torsional vibration so as to cause a torque in the ultrasound horn about the y axis, wherein the torsional vibration generator further comprises:
   a body having at least a side surface located at a predetermined distance from the y axis in a width direction along a x axis that is perpendicular to the y axis; and
   at least one second layered element located adjacent to the side surface and having at least a pair of second piezoelectric elements for shear-deforming to generate reciprocating rotational movement for the torque.

* * * * *